United States Patent
Black et al.

(10) Patent No.: US 8,608,894 B2
(45) Date of Patent: Dec. 17, 2013

(54) WAFER LEVEL PACKAGED FOCAL PLANE ARRAY

(75) Inventors: Stephen H. Black, Buellton, CA (US); Thomas A. Kocian, Dallas, TX (US)

(73) Assignee: Raytheon Company, Waltham, MA (US)

( * ) Notice: Subject to any disclaimer, the term of this patent is extended or adjusted under 35 U.S.C. 154(b) by 174 days.

(21) Appl. No.: 13/298,955

(22) Filed: Nov. 17, 2011

(65) Prior Publication Data

US 2012/0139072 A1    Jun. 7, 2012

Related U.S. Application Data

(60) Provisional application No. 61/416,563, filed on Nov. 23, 2010.

(51) Int. Cl.
*G01J 1/04* (2006.01)

(52) U.S. Cl.
USPC .................................. 156/280; 250/338.4

(58) Field of Classification Search
USPC .................. 156/280; 250/332, 338.4, 339.04, 250/339.08
See application file for complete search history.

(56) References Cited

U.S. PATENT DOCUMENTS

| | | | |
|---|---|---|---|
| 6,352,935 B1 | 3/2002 | Collins et al. | |
| 7,510,947 B2 | 3/2009 | Shao et al. | |
| 7,561,284 B2 | 7/2009 | Yahagi | |
| 7,598,125 B2 | 10/2009 | Shao et al. | |
| 2006/0208190 A1* | 9/2006 | Wood | 250/339.08 |

OTHER PUBLICATIONS

Zhao et al., "24.5% Efficiency Silicon PERT Cells on MCZ Substrates and 24.7% Efficiency PERL Cells on FZ Substrates," © 1999 John Wiley & Sons, Ltd., 1999.

* cited by examiner

*Primary Examiner* — Thomas L Dickey
(74) *Attorney, Agent, or Firm* — Lando & Anastasi, LLP

(57) ABSTRACT

A method for manufacturing a wafer level packaged focal plane array, in accordance with certain embodiments, includes forming a detector wafer, which may include forming detector arrays and read-out circuits. The method may also include forming a lid wafer. Forming the lid wafer may include polishing a surface of a magnetically confined Czochralski (MCZ) wafer, bonding a Czochralski wafer to the MCZ wafer, and forming pockets in the Czochralski wafer. Each pocked may expose a portion of the polished surface of the MCZ wafer. The method may further include bonding the lid wafer and the detector wafer together such that the each detector array and read-out circuit are sealed within a different pocket, thereby forming a plurality of wafer level packaged focal plane arrays. The method may additionally include separating at least one wafer level packaged focal plan array from the plurality of wafer level packaged focal plane arrays.

18 Claims, 3 Drawing Sheets

WAFER LEVEL PACKAGED FOCAL PLANE ARRAY

RELATED APPLICATIONS

This application claims the benefit under 35 U.S.C. §119(e) of U.S. Provisional Application Ser. No. 61/416,563 filed Nov. 23, 2010.

TECHNICAL FIELD

This invention relates generally to wafer level packaged focal plane arrays.

BACKGROUND

A packaged focal plane array comprises a detector array, an associated read-out circuit, and a transmissive cover that seals the detector array and read-out circuit. One way in which focal plane arrays are packaged involves first fabricating several detector arrays with their corresponding read-out circuits. Each focal plane array is then individually covered and sealed with a transmissive cover. The cover is typically applied in a separate process and is made of germanium or float-zone silicon.

SUMMARY OF THE DISCLOSURE

In accordance with particular embodiments, a method for manufacturing a wafer level packaged focal plane array includes forming a detector wafer. Forming the detector wafer may include forming a plurality of detector arrays. Each detector array may comprise a plurality of individual detectors. Forming a detector wafer may further include forming a plurality of read-out circuits. Each read-out circuit may be associated with a different detector array. The method may also include forming a lid wafer. Forming the lid wafer may include polishing at least one surface of a magnetically confined Czochralski (MCZ) wafer. Forming the lid wafer may additionally include bonding a Czochralski wafer and the MCZ wafer together. Forming the lid wafer may further include forming a plurality of pockets in the Czochralski wafer. Each pocket may expose a portion of the at least one polished surface of the MCZ wafer. The method may also include bonding the lid wafer and the detector wafer together such that the each detector array and read-out circuit are sealed within a different pocket. This may form a plurality of wafer level packaged focal plane arrays. The method may further include separating at least one wafer level packaged focal plane array from the plurality of wafer level packaged focal plane arrays.

Certain embodiments of the invention may provide one or more technical advantages. For example, a technical advantage of one embodiment may be that one or more focal plane arrays may be made using an MCZ wafer in a wafer level packaged detector. This may reduce the cost of the detectors and/or decrease the manufacturing time. Other technical advantages will be readily apparent to one skilled in the art from the following figures, descriptions and claims. Moreover, while specific advantages have been enumerated above, various embodiments may include all, some, or none of the enumerated advantages.

BRIEF DESCRIPTION OF THE DRAWINGS

For a more complete understanding of particular embodiments and their advantages, reference is now made to the following description, taken in conjunction with the accompanying drawings, in which.

DETAILED DESCRIPTION OF THE DRAWINGS

Figure 1:
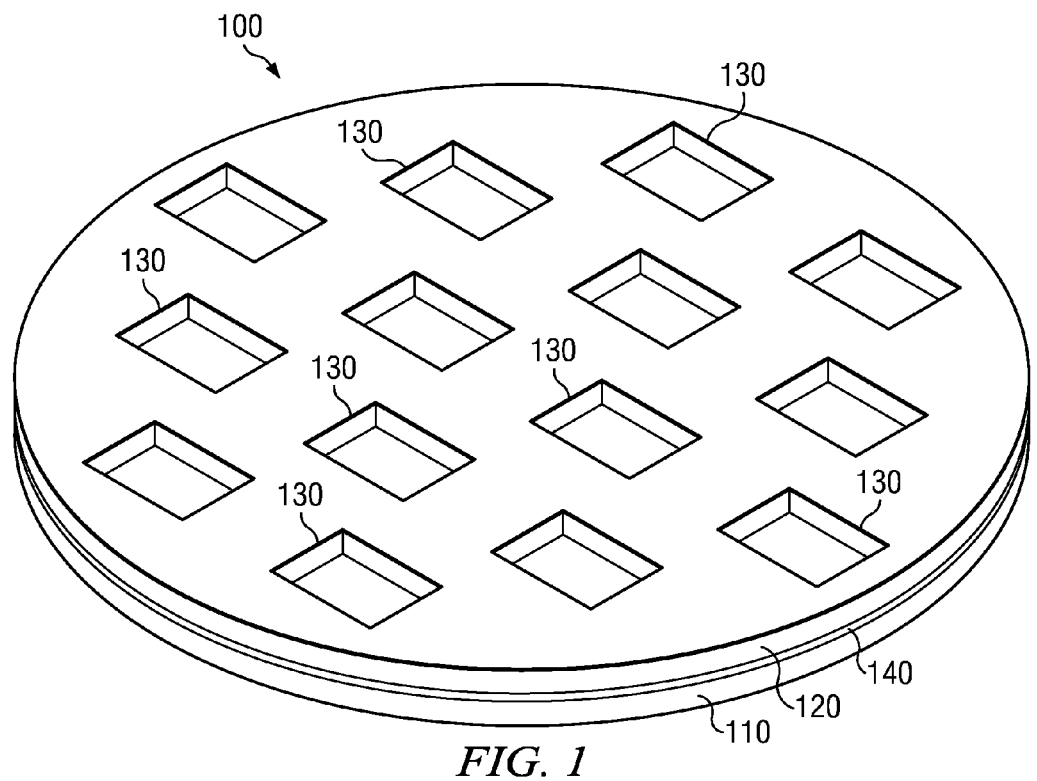
FIG. 1 illustrates an example lid wafer used in manufacturing a wafer level packaged focal plane array, in accordance with particular embodiments.

FIG. 1 illustrates an example lid wafer used in manufacturing a wafer level packaged focal plane array, in accordance with particular embodiments. Lid wafer 100 may function as a cover for a plurality of different wafer level packaged focal plane arrays. As such, lid wafer 100 may seal a plurality of detector arrays and their corresponding read-out circuits from the surrounding environment. For convenience, a detector array and its corresponding read-out circuit may be referred to generally as a focal plane array (FPA). The detector array of a wafer level packaged focal plane array may include any of a variety of different detectors, such as long-wave infrared detectors, short-wave infrared detectors, near infrared detectors, or any other detector capable of capturing images, thermal or otherwise. In FIG. 1, lid wafer 100 is depicted from a perspective showing the underside of lid wafer 100. The underside of lid wafer 100 may comprise the surface of lid wafer 100 that is bonded to a substrate of a detector wafer comprising the plurality of focal plane arrays. Lid wafer 100 may be aligned with the detector wafer such that each pocket 130 aligns with a different focal plane array.

In the depicted embodiment, lid wafer 100 may comprise several pockets 130 formed in Czochralski wafer 120 (CZ wafer 120). Each pocket 130 may correspond to a different focal plane array and may be configured such that the focal plane array is able to fit within the corresponding pocket 130. Pockets 130 may be covered by a polished magnetically confined Czchralski wafer 110 (MCZ wafer 110).

MCZ wafer 110 may be formed from high purity, low oxygen silicon. In some scenarios, MCZ wafer 110 may be a silicon wafer readily available in 200 millimeter and 300 millimeter wafer sizes. In some embodiments, MCZ wafer 110 may be transmissive to a variety of wavelengths of incident radiation, including both mid wave infrared (e.g. light between 3 micrometers and 5 micrometers) and long wave infrared (e.g. light between 7 micrometers and 14 micrometers). For example, MCZ wafer 110 may be used as a cover for a long wave infrared (IR) detector used for IR imaging. In some embodiments, MCZ wafer 110 may be coated with one or more materials to better refine or filter the bandwidth with which lid wafer 110 is transmissive. For example, MCZ wafer 110 may be coated with an anti-reflective coating. As another example, MCZ wafer 110 may be patterned with a sub-wavelength structure to allow long wave infrared light to more efficiently reach a covered focal plane array. In certain embodiments, MCZ wafer 110 may be polished on both sides to reduce the impact of MCZ wafer 110 on incident radiation passing through MCZ wafer 110 to better allow light to pass through. For example, MCZ wafer 110 may be polished optical quality standards. In some embodiments, MCZ wafer 110 may be between approximately 200 and 1500 micrometers thick. For example, in particular embodiments, MCZ wafer 110 may be approximately 725 micrometers thick.

While in FIG. 1 CZ Wafer 120 is made from CZ silicon, any of a variety of bulk silicon wafers may be used for CZ wafer 120. In particular embodiments, CZ wafer 120 may be a support which keeps MCZ wafer 110 elevated above a corresponding focal plane array being covered by lid wafer 100. The thickness of CZ Wafer 120 may vary depending on the thickness of the focal plane array being covered by lid wafer 100 and/or a desired gap size between the focal plane array and MCZ wafer 110. Depending on the scenario, CZ wafer 120 may be between approximately 50 and 1,000 micrometers thick. For example, in some embodiments, CZ wafer 120 may be approximately 300 micrometers thick.

In some embodiments, CZ wafer 120 may be bonded with MCZ wafer 120 through thermal oxide layer 140. For example, thermal oxide layer 140 may be grown on MCZ wafer 110 or CZ wafer 120 prior to bonding. Then oxide layer 140 may be used in thermally bonding CZ wafer 120 with MCZ wafer 110. In addition to aiding in the bonding of CZ wafer 120 and MCZ wafer 110, thermal oxide layer 140 may act as an etch stop when pockets 130 are formed.

The length, width, and depth of pockets 130 may correspond to the length, width, and height of a focal plane array. This may allow the focal plane array to fit within pocket 130. The depth of pockets 130 may be controlled by the thickness of CZ wafer 120. Pockets 130 may be formed in CZ wafer 120 using any of a variety of techniques performed either before or after CZ wafer 120 is bonded with MCZ wafer 110. For example, in some embodiments, pockets 130 may be formed by reactive ion etching of CZ wafer 120. In such an embodiment, thermal oxide layer 140 may stop the reactive ion etching from reaching MCZ wafer 110. This may help to prevent any corrosive impact of the reactive ion etching affecting the polish of MCZ wafer 110. Once pockets 130 have been etched in CZ wafer 120, thermal oxide layer 140 may be removed from pockets 130 and the polished surface of MCZ wafer 110 may be exposed. This may allow any light to pass through MCZ layer wafer 110 and reach the underlying focal plane array. As another example, pockets 130 may be formed in CZ wafer 120 before it is bonded to MCZ wafer 110. For example, pockets 130 may be cut-out of CZ wafer 120 or CZ wafer 120 may be manufactured with pockets 130 formed therein.

Figure 2:
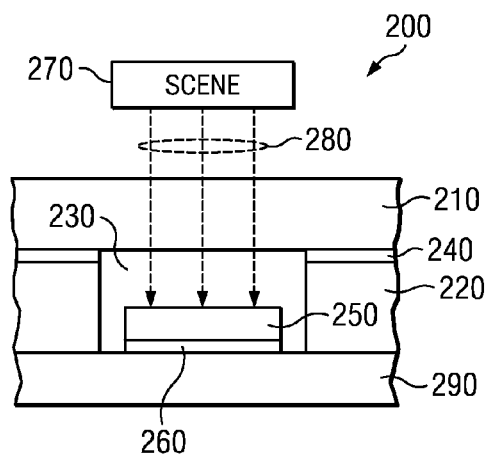
FIG. 2 illustrates a cut-away block diagram of a wafer level packaged focal plane array, in accordance with particular embodiments.

FIG. 2 illustrates cut-away block diagram of wafer level packaged focal plane array, in accordance with particular embodiments. In the depicted embodiment, wafer level packaged FPA 200 is shown receiving incident radiation 280 (e.g., long-wave infrared, short-wave infrared, mid-wave infrared, etc.) from scene 270. Incident radiation 280 passes through MCZ layer 210 and is measured by detector array 250 and read-out circuit 260. For example, readout circuit 260 may determine changes in the resistance of individual detectors in detector array 250 in response to incident radiation 280. These changes in resistance may be used to generate an image of scene 270.

The bandwidth range or spectrum range of incident radiation 280 that reaches detector array 250 may depend on a coating applied to MCZ layer 210. For example, MCZ layer 210 may comprise a low oxygen content and polished surfaces that may allow a broad range of incident radiation to pass there through without absorbing or reflecting a substantial amount of radiation 280. A coating of one or more layers of material, such as zinc sulfide and/or germanium may be applied MCZ layer 210. The coating may filter particular bands of incident radiation 280. The filtering may be based on the intended application or use of wafer level packaged FPA 200. The use of MCZ silicon for MCZ layer 210 may be in contrast to traditionally packaged FPAs in which the cover window may be made out of germanium or float zone silicon.

In the depicted embodiment, MCZ layer 210 may be bonded with CZ layer 220 via thermal oxide layer 240. Thermal oxide layer 240 may function as both a bonding material when bonding MCZ layer 210 and CZ layer 220 together, and an etch stop when forming pocket 230. Before CZ layer 220 is bonded to silicon substrate 290, any thermal oxide in pocket 230 may be removed so that it does not interfere with incident radiation 280 reaching detector array 250.

Once CZ layer 220 is bonded with silicon substrate 290, CZ layer 220 may support MCZ layer 210 above detector array 250 and readout circuit 260. This may create a hermetically sealed cavity within which detector array 250 and read-out circuit 260 are housed.

Detector array 250 may comprise any of a variety of different detectors configured to detect any of a variety of different wave lengths of incident radiation 280. The type of detectors of detector array 250 and the coating applied to MCZ layer 210 may correspond with one another. For example, if detector array 250 is configured to detect short-wave IR, MCZ layer 210 may be coated with a material that is transmisive for short-wave IR and/or absorbs or reflects wavelengths other than short-wave IR.

In particular embodiments, detector array 250 may comprise a two dimensional array of individual detectors, each detector may individually be responsive to incident radiation 280. The dimensions of the two dimensional array may vary depending on the intended application. For example, in some embodiments the two dimensional array may comprise 640 columns by 480 rows. In some embodiments, detector array 250 may comprise a microbolometer detector array. Each microbolometer may experience a change in resistance due to a change in temperature caused by incident radiation 280. The change in resistance may be determined and/or interpreted by read-out circuit 260. The resulting signal from read-out circuit 260 may be used to generate an image, such as a thermal image, of scene 270.

Detector array 250 and read-out circuitry 260 may be formed on substrate 290. Substrate 290, detector array 250, and read-out circuitry 260 may be a portion of a larger detector wafer. The detector wafer may be approximately the same size and shape as lid wafer 100 depicted in FIG. 1. The detector wafer may comprise a number of detector arrays and read-out circuits formed on a single substrate 290. The number of detector arrays and read-out circuits may correspond to the number of pockets on the lid wafer.

Figure 3A:
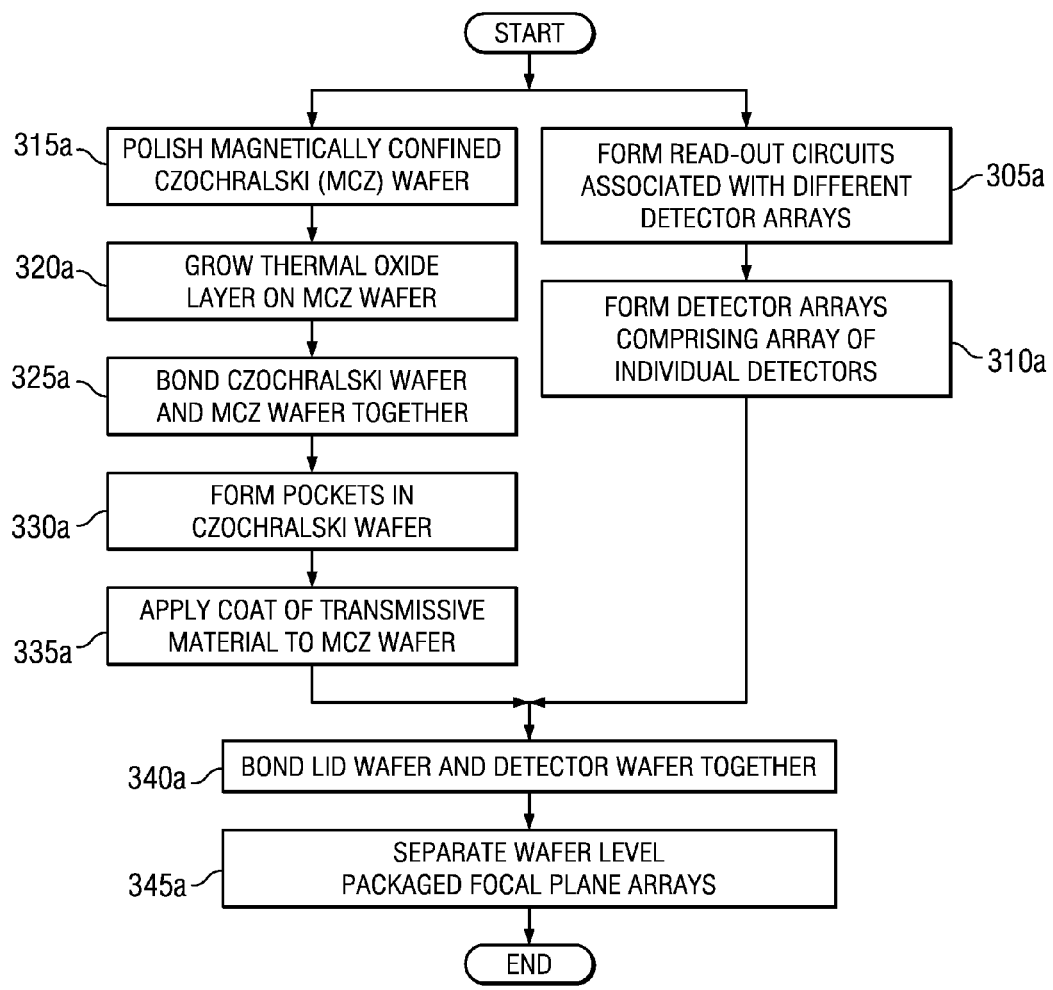
FIGS. 3A and 3B illustrate a method of manufacturing a wafer level packaged focal plane array, in accordance with particular embodiments.
Figure 3B:
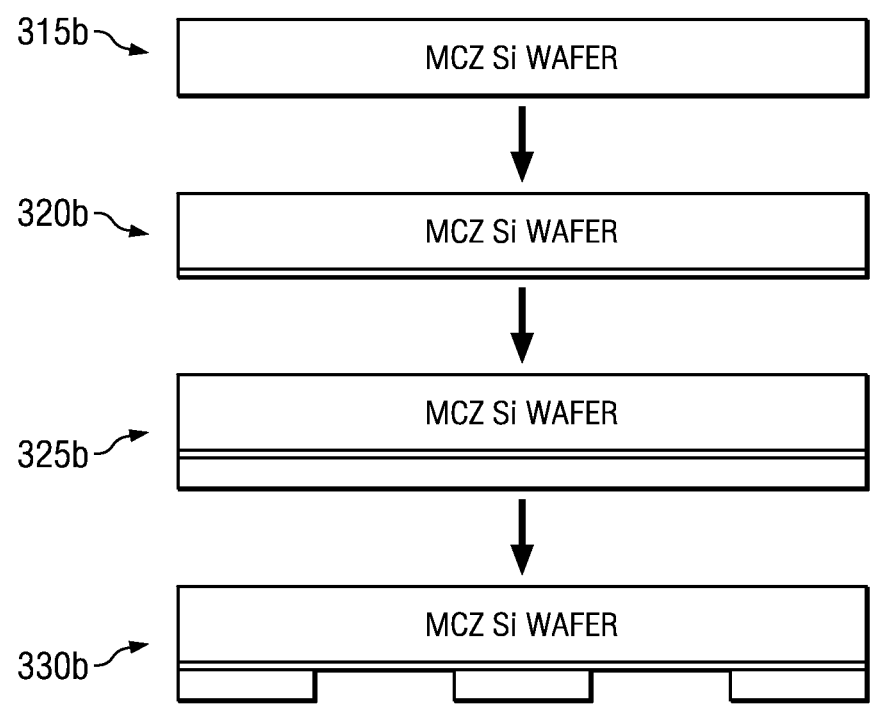

FIGS. 3A and 3B illustrate a method of manufacturing a wafer level packaged focal plane array, in accordance with particular embodiments. FIG. 3A depicts a flowchart showing certain steps of a method for manufacturing wafer level packaged FPAs. FIG. 3B depicts different layers of a wafer level packaged FPA at various stages during the manufacturing of a wafer level packaged FPA. The layers in FIG. 3B may be numbered to correspond to the numbering of the steps illustrated in FIG. 3A. For example, layer 315b may correspond to step 315a.

The method begins at step 305a with the formation of multiple detector arrays. The detector arrays may be formed on a single silicon substrate. Each detector array may be a separate detector array. Each detector array formed at step 305a may comprise a two dimensional array of individual detectors. The type of detectors may vary depending on the embodiment, or scenario. For example, in some embodiments, the individual detectors may comprise microbolometer detectors that may be used to generate thermal images.

At step 310a, multiple read-out circuits are formed. Each read-out circuit may be associated with a different detector array. In certain embodiments, both the detector array and the readout circuit may be formed on the same silicon substrate. Depending on the embodiment, the read-out circuits may be formed before, after, or con-currently with, the detector arrays. Each read-out circuit may be configured to generate a signal, such as an image signal, based on the responses from the detectors of the corresponding detector array.

Each detector array and read-out circuit pair may form a focal plane array. The multiple detector arrays and read-out circuits may thus form multiple focal plane arrays. The multiple focal plane arrays may be formed on the same silicon wafer. The wafer comprising the multiple focal plane arrays may be referred to as a detector wafer. In some embodiments, the detector wafer may be considered a micro-electrical-mechanical system (MEMS) wafer. In some embodiments, steps 305a and 310a may be combined into a single step of receiving a detector wafer.

At step 315a a magnetically confined czochralski wafer (MCZ wafer) is polished. The MCZ wafer may be polished to a semiconductor standard (e.g., having a roughness less than 1 nanometer). For example, the MCZ wafer may be polished using techniques used to polish glass lenses. This may help reduce the impact of the MCZ wafer on incident radiation that may pass through the polished MCZ wafer. The polished MCZ wafer may act as a window substrate covering the multiple focal plane arrays. For example, in some embodiments, the MCZ wafer may cover multiple uncooled long-wave IR detectors.

In certain embodiments, silicon grown by the MCZ technique may be used to produce MCZ wafers that may have low oxygen content. In typical silicon wafers, the oxygen level is such that wavelengths greater than 9 micrometers are often absorbed due to the presence of oxygen in the silicon. These wavelengths are often used with infrared detectors thus making typical silicon a less desirable material for a cover for a long-wave infrared detector. Accordingly, because of the relatively low oxygen content of the MCZ grown silicon, the MCZ wafer may be transmissive with respect to light in a band such as 7 micrometers to 14 micrometers. MCZ silicon may be grown at any suitable size of wafer, such as 200 millimeters (mm) or 300 mm. The optical properties of an MCZ wafer may be equivalent to that of a float zone silicon wafer. Layer 315b depicts a side view of a portion of a MCZ wafer.

At step 320a a thermal oxide layer is grown on the MCZ wafer. The thermal oxide layer may provide two functions. First, the thermal oxide layer may provide adhesion between the MCZ wafer and the CZ wafer for bonding the two wafers together at step 325a, discussed below. Second, the thermal oxide layer may provide an etch stop. As an etch stop, the thermal oxide layer may stop the chemical etch used in forming the pockets in the CZ wafer at step 330a, discussed below, from reaching the MCZ wafer. This may prevent the chemical etch from marring the polished surface of the MCA wafer. Layer 320b depicts the thermal oxide layer formed along the bottom surface of the MCZ wafer.

At step 325a the CZ wafer and the MCZ wafer are bonded together. In the example embodiment, the thermal oxide layer grown at step 320a may be used to oxide bond the CZ wafer and the MCZ wafer together. Although in this example embodiment oxide bonding is used to bond the two wafers together, other embodiments may use other techniques for bonding the two wafers together. For example, direct silicon bonding without the presence of oxide. As another example, adhesive bonding may be used. As may be apparent, if the two wafers are bonded together using something other than the thermal oxide layer grown at step 320a, then step 320a may be omitted or replaced with a different step in which the adhesion used to bond the two wafers is applied or grown. As discussed above, the CZ wafer may have a thickness based on the height of the focal plane array and/or the size of the gap desired between the focal plane array and the MCZ wafer. For example, the greater the height of the focal plane array above its silicon substrate, the thicker the CZ wafer. As can be seen in layer 325b, the MCZ wafer and the CZ wafer are bonded together into a single stack with the thermal oxide layer there between.

At step 330a pockets are formed in the CZ wafer. In some embodiments, the pockets formed in the CZ wafer may be formed using deep reactive-ion etching (DRIE). Using DRIE, the thermal oxide layer grown on the bottom of the MCZ wafer may act as an etch stop preventing the ion etch from marring the polished surface of the MCZ wafer. The size of the pockets formed at step 330a, may correspond to the size of the detector array and its corresponding readout circuit. After the CZ wafer has been etched, the thermal oxide layer may be removed. Thus, once the pockets have been formed, a corresponding area of the MCZ wafer may be exposed for each pocket that is formed. Layer 330b depicts the pockets made in the CZ layer as well as the thermal oxide layer. Layer 330b may illustrate a portion of a completed lid wafer.

At step 335a a coat of transmissive material is applied to the pockets and/or the top of the MCZ wafer. The material may be applied to filter particular bandwidths of incident radiation. The type of material applied may vary depending on the desired application. That is, depending on the wavelengths of radiation desired to reach the focal plane array, different transmissive materials may be applied to the MCZ wafer. In some embodiments, the material applied may be transmissive to light having wavelengths between 7 micrometers and 14 micrometers. These may be a common bandwidth range used for long-wave infrared imaging. In some embodiments, multi layer coating consisting of alternating layers of germanium and zinc selenide may be applied to the top, polished, surface of the MCZ wafer and/or the pockets of the MCZ wafer. In some embodiments, the transmissive material may comprise an anti-reflective coating that may be applied to the MCZ wafer. In certain embodiments, more than one coat of transmissive material may be applied. Although the transmissive material is shown being applied after the lid wafer and the detector wafer have been bonded together, in certain embodiments, the transmissive material may be applied before the lid wafer and the detector wafer are bonded together. In certain embodiments, the transmissive material may be applied to the top surface of the MCZ wafer after bonding.

At step 340a the lid wafer and detector wafer are bonded together. The lid wafer may correspond to a wafer formed from steps 315a to 330a and the detector wafer may correspond to a wafer formed from steps 305a to 310a. The lid wafer and the detector wafer may be bonded together such that the pockets formed at step 330a in the lid wafer correspond to the focal plane arrays formed at steps 305a and 310a in the detector wafer. In bonding the lid wafer and the detector wafer, lid wafer may cover and/or seal the components of the detector wafer within individual pockets. This provides protection for each of the focal plane arrays. The single lid wafer used to cover and seal each of the focal plane arrays of the detector wafer may allow an entire wafer of focal plane arrays to be covered in a single step (as opposed to covering and sealing each focal plane array individually). Because a single lid wafer is used for a single detector wafer, the resulting focal plane array may be considered a wafer level packaged focal plane array. This may be in contrast to traditionally packaged focal plane arrays in which a cover for the focal plane array is put on after the detector wafer has been sawn up into individual detectors. Packaging the focal plane arrays at the wafer level may reduce the cost and the manufacturing time needed to produce packaged focal plane arrays.

At step 345a the individual wafer level packaged focal plane arrays are separated. Each wafer level packaged focal plane array that is separated comprises both a focal plane array and a cover. Thus, each focal plane array may be sealed, protected and ready to be used in any desired application.

Some of the steps illustrated in FIG. 3 may be combined, modified or deleted where appropriate, and additional steps may also be added to the flowchart. Additionally, steps may be performed in any suitable order without departing from the scope of particular embodiments. The steps depicted in FIG. 3A are just an example of the steps performed for a particular embodiment, other embodiments may use different steps arranged in a different order. For example, in some embodiments, the MCZ wafer may be polished more than once. For example, the lower surface of the MCZ wafer may be polished first at step 315a. Then, at a later time (e.g., after step 340a), the upper surface of the MCZ wafer may be polished. As another example, in some embodiments, the method may include receiving a detector wafer that has already formed. In such a scenario, steps 305a and 310a may be replaced with a single step of receiving a detector wafer. As another example, in some embodiments, the pockets may be etched (or otherwise formed) in the CZ wafer prior to the CZ wafer being bonded with the MCZ wafer. In such an embodiment, steps 325a and 330a may be switched. As yet another example, in some embodiments the coat of transmissive material may be applied to the MCZ wafer earlier than at step 335a. For example, the transmissive material may be applied after the MCZ wafer has been polished at step 315a.

Although particular embodiments have been described in detail, it should be understood that various other changes, substitutions, combinations and alterations may be made hereto without departing from the spirit and scope of the disclosure. It is intended that particular embodiments encompass all such changes, substitutions, variations, alterations and modifications as falling within the spirit and scope of the appended claims. For example, although an embodiment has been described with reference to a number of elements included in a wafer level packaged FPA, such as pockets, detector arrays, read-out circuits, an MCZ layer, and a CZ layer, these elements may be combined, rearranged or positioned in order to accommodate particular detection needs. In addition, any of these elements may be provided as integrated internal or separate external components to each other where appropriate. Particular embodiments contemplate great flexibility in the arrangement of these elements as well as their internal components.

What is claimed is:

1. A method comprising:
   polishing at least one surface of a magnetically confined Czochralski (MCZ) wafer;
   bonding a Czochralski wafer and the MCZ wafer together; and
   forming a plurality of pockets in the Czochralski wafer, the plurality of pockets configured to cover a corresponding plurality of focal plane arrays, each pocket exposing a different portion of the at least one polished surface of the MCZ wafer.

2. The method of claim 1, further comprising polishing a second surface of the MCZ wafer.

3. The method of claim 1, wherein the plurality of pockets in the Czochralski wafer are formed before the Czochralski wafer and the MCZ wafer are bonded together.

4. The method of claim 1, further comprising, prior to bonding the Czochralski wafer and the MCZ wafer, growing a thermal oxide layer on the at least one polished surface of the MCZ wafer.

5. The method of claim 1, wherein forming a plurality of pockets in the Czochralski wafer comprises etching a plurality of pockets in the Czochralski wafer using reactive ion etching.

6. The method of claim 1, further comprising, applying an anti-reflective coating prior to bonding the Czochralski wafer and the MCZ wafer together.

7. The method of claim 1, further comprising, applying an anti-reflective coating after bonding the Czochralski wafer and the MCZ wafer together.

8. The method of claim 1, further comprising covering the corresponding plurality of focal plane arrays with the bonded MCZ and Czochralski wafers to form a corresponding plurality of wafer level packaged focal plane arrays.

9. The method of claim 8, further comprising separating at least one wafer level packaged focal plane array from a remaining plurality of wafer level packaged focal plane arrays.

10. The method of claim 8, further comprising applying at least one coat of light transmissive material to the MCZ wafer, the coat of light transmissive material and the MCZ wafer allowing light having a wavelength between approximately 7 and 14 micrometers to reach the corresponding plurality of focal plane arrays.

11. A wafer level packaged focal plane array, comprising:
    a focal plane array comprising a two-dimensional array of detectors and a read-out circuit;
    a Czochralski layer coupled to the focal plane array and surrounding the two-dimensional array of detectors and the read-out circuit; and
    a magnetically confined Czochralski (MCZ) silicon layer coupled to the Czochralski layer and configured to seal at least the two-dimensional array of detectors and the read-out circuit of the focal plane array in a cavity.

12. The wafer level packaged focal plane array of claim 11, further comprising a thermal oxide layer configured to bond the MCZ silicon layer and the Czochralski layer together.

13. The wafer level packaged focal plane array of claim 11, wherein the MCZ silicon layer comprises at least one polished surface.

14. The wafer level packaged focal plane array of claim 11, further comprising at least one coat of material applied to the MCZ silicon layer, the at least one coat of material and the MCZ silicon layer configured to allow light having a wavelength between approximately 7 and 14 micrometers to reach the detector array.

15. The wafer level packaged focal plane array of claim 11, wherein the MCZ silicon layer is a portion of an MCZ wafer, the MCZ wafer configured to cover a plurality of focal plane arrays formed on a detector wafer.

16. The wafer level packaged focal plane array of claim 11, wherein the Czochralski layer coupled to the detector array is a portion of a Czochralski wafer, the Czochralski wafer configured to individually surround a plurality of focal plane arrays formed on a detector wafer.

17. The wafer level packaged focal plane array of claim 16, wherein the Czochralski wafer comprises a plurality of pockets etched of the Czochralski wafer, each pocket of the plurality of pockets configured to surround a different focal plane array formed on the detector wafer.

18. A method for manufacturing a wafer level packaged focal plane array, comprising:

forming a detector wafer, wherein forming the detector wafer comprises:
  forming a plurality of detector arrays, each detector array comprising a two-dimensional array of individual detectors; and
  forming a plurality of read-out circuits, each read-out circuit associated with a different detector array;
forming a lid wafer, wherein forming the lid wafer comprises:
  polishing at least one surface of a magnetically confined Czochralski (MCZ) wafer;
  bonding a Czochralski wafer and the MCZ wafer together; and
  forming a plurality of pockets in the Czochralski wafer, each pocket exposing a portion of the at least one polished surface of the MCZ wafer;
bonding the lid wafer and the detector wafer together such that each detector array and read-out circuit are sealed within a different pocket to form a plurality of wafer level packaged focal plane arrays; and
separating at least one wafer level packaged focal plane array from the plurality of wafer level packaged focal plane arrays.

* * * * *